(12) United States Patent
Kim et al.

(10) Patent No.: US 7,656,147 B2
(45) Date of Patent: Feb. 2, 2010

(54) METHOD AND APPARATUS FOR MEASURING PULSE WIDTHS OF A SIDE-BAND SIGNAL

(75) Inventors: Hyung-seuk Kim, Seoul (KR); Jae-kwan Kim, Seongnam-si (KR)

(73) Assignee: Samsung Electronic Co., Ltd., Gyeonggi-do (KR)

( * ) Notice: Subject to any disclaimer, the term of this patent is extended or adjusted under 35 U.S.C. 154(b) by 268 days.

(21) Appl. No.: 11/976,922

(22) Filed: Oct. 30, 2007

(65) Prior Publication Data

US 2008/0100346 A1     May 1, 2008

(30) Foreign Application Priority Data

Oct. 30, 2006  (KR)  .................. 10-2006-0105626

(51) Int. Cl.
G01R 25/00 (2006.01)
H01D 13/00 (2006.01)
H03K 7/08 (2006.01)
H03L 7/06 (2006.01)

(52) U.S. Cl. .................. 324/76.77; 375/238; 375/376; 327/157

(58) Field of Classification Search .............. 324/76.77, 324/76.52, 76.53, 76.11; 375/226, 376, 371, 375/373, 374, 238; 327/147, 148, 156, 157, 327/536; 331/1 A, 1 R
See application file for complete search history.

(56) References Cited

U.S. PATENT DOCUMENTS

| 3,623,105 | A | * | 11/1971 | Kamen et al. ................ 455/102 |
| 5,315,270 | A |   | 5/1994  | Leonowich |
| 6,249,685 | B1 | * | 6/2001 | Sharaf et al. .................. 455/84 |
| 7,061,290 | B2 | * | 6/2006 | Hasegawa .................... 327/157 |
| 7,436,965 | B2 | * | 10/2008 | Sherman ..................... 380/278 |
| 7,496,136 | B2 | * | 2/2009 | Lindner et al. .............. 375/226 |
| 2002/0114386 | A1 | * | 8/2002 | Eklof ......................... 375/238 |

FOREIGN PATENT DOCUMENTS

| JP | 2000-201069 | 7/2000 |
| JP | 2004-254320 | 9/2004 |
| JP | 2005-123944 | 5/2005 |

* cited by examiner

Primary Examiner—Hoai-An D Nguyen
(74) Attorney, Agent, or Firm—Harness, Dickey & Pierce, P.L.C.

(57) ABSTRACT

Example embodiments are directed to an apparatus and method for measuring a pulse width. A side-band signal generator may be configured to receive a given data pattern and output a side-band signal by modulating a pulse width of the received data pattern in a test mode. A phase detector may be configured to receive the side-band signal and a reference clock signal, and output a pulse signal corresponding to a phase difference between the received side-band signal and the reference clock signal. A charge pump may be configured to receive the pulse signal and output an output voltage by increasing or decreasing the output voltage based on the pulse signal. A pulse width measurer may be configured to receive the output voltage of the charge pump and determine whether pulses forming the side-band signal have appropriate widths based on whether the output voltage is included in a desired reference voltage range.

26 Claims, 7 Drawing Sheets

METHOD AND APPARATUS FOR MEASURING PULSE WIDTHS OF A SIDE-BAND SIGNAL

PRIORITY STATEMENT

This application claims the benefit of Korean Patent Application No. 10-2006-0105626, filed on Oct. 30, 2006, in the Korean Intellectual Property Office, the entire contents of which is hereby incorporated by reference.

BACKGROUND

1. Field

Example embodiments are directed to a method and apparatus for testing a signal, for example, a method and apparatus for measuring pulse widths a side-band signal.

2. Description of the Related Art

In communication fields, side-band signal or out-of-band signal is widely used since high speed communication is possible as the side-band signals or the out-of-band signals do not use a separate bus, but use a wire or an infrared port.

FIG. 1 is a diagram illustrating a side-band signal SBS including a plurality of pulses. Referring to FIG. 1, each pulse of the side-band signal SBS may indicate 0 or 1. However, unlike other conventional data bits, classification into logic high "H" and logic low "L" may be achieved with reference to the length of each pulse width. For example, when the length of a pulse width in one bit period is larger than approximately 50% of a duty cycle, the bit may be recognized as logic "H", and when the length of a pulse width in one bit period is smaller than approximately 50% of a duty cycle, the bit is recognized as logic "L". Thus, a bit value may be determined based on a relative duration of a pulse width in a bit period.

SUMMARY

According to example embodiments, an apparatus for measuring a pulse width may include a side-band signal generator, a phase detector, a charge pump and/or a pulse width measurer. The side-band signal generator may be configured to receive a given data pattern and output a side-band signal by modulating a pulse width of the received data pattern in a test mode. The phase detector may be configured to receive the side-band signal and a reference clock signal, and output a pulse signal corresponding to a phase difference between the received side-band signal and the reference clock signal. The charge pump may be configured to receive the pulse signal and output an output voltage by increasing or decreasing the output voltage based on the pulse signal. The pulse width measurer may be configured to receive the output voltage of the charge pump and determine whether pulses forming the side-band signal have appropriate widths based on whether the output voltage is included in a desired reference voltage range.

The apparatus may also include a data pattern generator including a register. The register may store a plurality of data patterns. The data pattern generator may be configured to generate a data pattern selected in response to a test mode enable signal and a data pattern selection signal.

The pulse width measurer may include a register. The register may store a plurality of reference voltage ranges corresponding to each data pattern in a table. The pulse width measurer may be further configured to receive the data pattern selection signal, select a reference voltage range corresponding to the received data pattern selection signal, and compare the selected reference voltage range with the output voltage of the charge pump.

The phase detector may be configured to output an UP pulse signal having a pulse width corresponding to a phase difference between the received side-band signal and the reference clock signal when the phase of the side-band signal is lower than the phase of the reference clock signal. The phase detector may also be configured to output a DOWN pulse signal having a pulse width corresponding to a phase difference between the received side-band signal and the reference clock signal when the phase of the side-band signal is higher than the phase of the reference clock signal.

The charge pump may be configured to receive the control signal and operate only when the control signal is enabled. The control signal may have enable segments corresponding to the number of bits of the side-band signal.

The apparatus may also include a reference clock generator configured to receive the side-band signal and generate a reference clock signal having substantially the same period as the received side-band signal. The phase detector may be configured to output the pulse signal by comparing phases of the received side-band signal and the reference clock while the side-band signal does not coincide with a rising edge of the reference clock signal.

The apparatus may also include a low pass filter configured to remove a high frequency component of the output voltage of the charge pump.

The number of bits of the data pattern may be 6. The ratio of 0-bits to 1-bits in the data pattern may be 1:1, 2:1, or 1:2.

According to example embodiments, a method of measuring a pulse width may include receiving a given data pattern and outputting a side-band signal by modulating a pulse width of the received data pattern in a test mode, receiving the side-band signal and a reference clock signal and outputting a pulse signal corresponding to a phase difference between the received side-band signal and the reference clock signal, receiving the pulse signal and outputting the output voltage by increasing or decreasing the output voltage based on the pulse signal, and/or receiving the output voltage and determining whether pulses forming the side-band signal have appropriate widths based on a comparison result between the received output voltage and the desired reference voltage range.

The method may also include generating a data pattern selected from among a plurality of data patterns in response to a test mode enable signal and a data pattern selection signal. Determining whether the pulses have appropriate widths may be performed by selecting a reference voltage range corresponding to the data pattern selection signal from a register, and comparing the selected reference voltage range and the output voltage.

Outputting the pulse signal may include outputting an UP pulse signal having a pulse width corresponding to a phase difference between the side-band signal and the reference clock when the phase of the side-band signal is lower than the phase of the reference clock, and outputting a DOWN pulse signal having a pulse width corresponding to a phase difference between the side-band signal and the reference clock when the phase of the side-band signal is higher than the phase of the reference clock.

Outputting the output voltage may be controlled by a control signal. The control signal may have enable segments corresponding to the number of bits of the side-band signal. The reference clock may have substantially the same period as the side-band signal.

Outputting the pulse signal may include outputting the pulse signal by comparing phases of the received side-band signal and the reference clock while the side-band signal does not coincide with a rising edge of the reference clock signal. The method may also include removing a high frequency component of the output voltage.

The number of bits of the data pattern may be 6. The ratio of 0-bits to 1-bits in the data pattern may be 1:1, 2:1, or 1:2.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
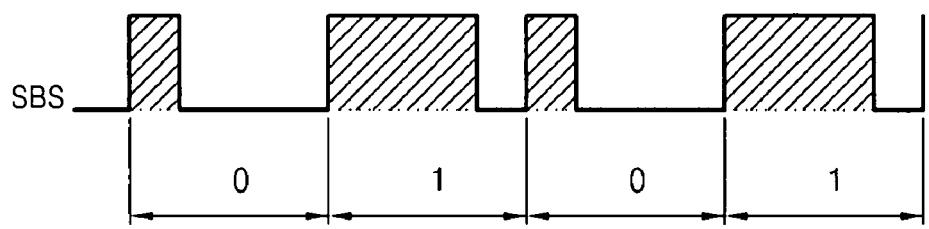
FIG. 1 is a diagram illustrating a conventional side-band signal including a plurality of pulses.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
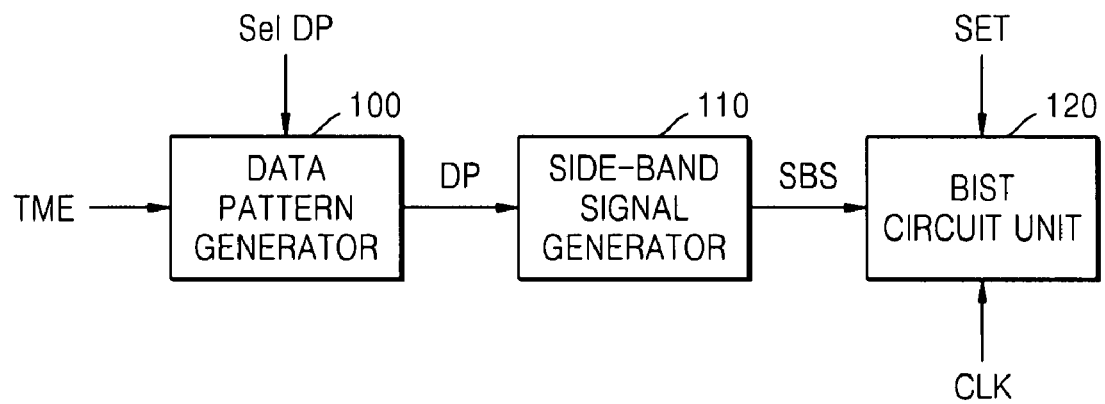
FIG. 2 is a block diagram illustrating an apparatus for measuring a pulse width according to an example embodiment.

FIG. 2 is a block diagram illustrating an apparatus for measuring a pulse width according to an example embodiment.

The apparatus may include a data pattern generator 100, a side-band signal generator 110, and/or a built-in-self-test (BIST) circuit unit 120.

In a test mode, the data pattern generator 100 may receive a test mode enable signal TME and may generate a given data pattern DP in response to a data pattern selection signal Sel DP. The data pattern DP may be outputted from a register (not shown), in which a plurality of data patterns may be stored in a table. The register may be included in the data pattern generator 100.

The side-band signal generator 110 may receive the given data pattern DP, modulate widths of pulses included in the data pattern DP, and output the data pattern DP with modulated pulse widths. The data pattern DP with modulated pulse widths may be a side-band signal SBS. For example, when the data pattern DP is "0101", pulses having a constant level may be generated as the side-band signals SBS, which may each be maintained for 250 μs, 750 μs, 250 μs, and 750 μs, respectively, as illustrated in FIG. 1.

The BIST circuit unit 120 may receive the side-band signal SBS and a reference clock CLK, compare phases of the side-band signal SBS and the reference clock CLK, generate a pulse signal corresponding to the phase difference, and test whether pulses of the side-band signal SBS have appropriate widths based on whether a voltage corresponding to the generated pulse signal is in a desired reference voltage range. A control signal SET may be applied to the BIST circuit unit 120 to control operation of the BIST circuit unit 120.

Figure 3:
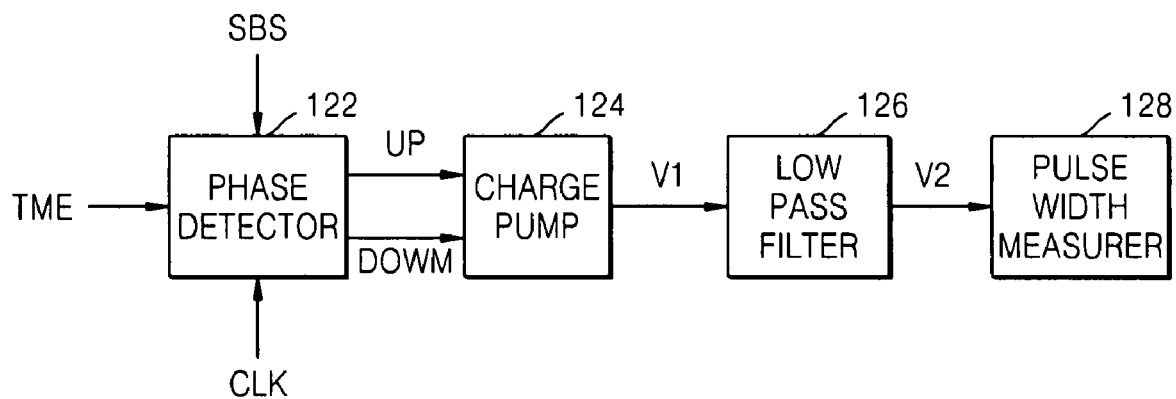
FIG. 3 is a block diagram illustrating an example built-in-self-test (BIST) circuit unit of FIG. 2.

FIG. 3 is a block diagram illustrating the BIST circuit unit 120 illustrated in FIG. 2.

The BIST circuit unit 120 according to an example embodiment may include a phase detector 122, a charge pump 124, a low pass filter 126, and/or a pulse width measurer 128.

The phase detector 122 may receive the side-band signal SBS and the reference clock CLK, compare the phases of the side-band signal SBS and the reference clock CLK, and generate an UP pulse signal and a DOWN pulse signal based on the phase difference. For example, when the phase of the side-band signal SBS is lower than the phase of the reference clock CLK, the UP pulse signal having a pulse width corresponding to that phase difference may be outputted. When the phase of the side-band signal SBS is higher than the phase of the reference clock CLK, the DOWN pulse signal having a pulse width corresponding to that phase difference may be outputted.

The charge pump 124 may receive the UP pulse signal or DOWN pulse signal, and output an output voltage V1 after increasing or decreasing the output voltage V1 based on the received UP pulse signal or DOWN pulse signal. For example, when the UP pulse signal is applied, the output voltage V1 may be increased to a given value, and when the DOWN pulse signal is applied, the output voltage V1 may be decreased to a given value.

The low pass filter 126 may output a voltage V2 by removing high frequency components of the output voltage V1 outputted from the charge pump 124. For example, the low pass filter 126 may be a capacitor with one terminal connected to an output terminal of the charge pump 124 and the other terminal connected to ground. The capacitor may have a sufficiently large capacitance to regulate or slow the time needed to charge-up and charge-down.

The voltage V2 outputted from the low pass filter 126 may be inputted to the pulse width measurer 128, where the voltage V2 may be compared with a desired reference voltage range. The reference voltage range may be outputted from a register (not shown) in which a plurality of reference voltage ranges corresponding to each data pattern may be stored in a table. The register may be disposed in the pulse width measurer 128. When the voltage V2 is outside the desired reference voltage range, it may be determined that the pulses of the generated side-band signal SBS have an error. When the voltage V2 is inside the desired reference voltage range, it may be determined that the pulses of the generated side-band signal SBS do not have an error. Relationships between the data pattern DP, the voltage V2, and the reference voltage range will be described in more detail later.

Figure 4:
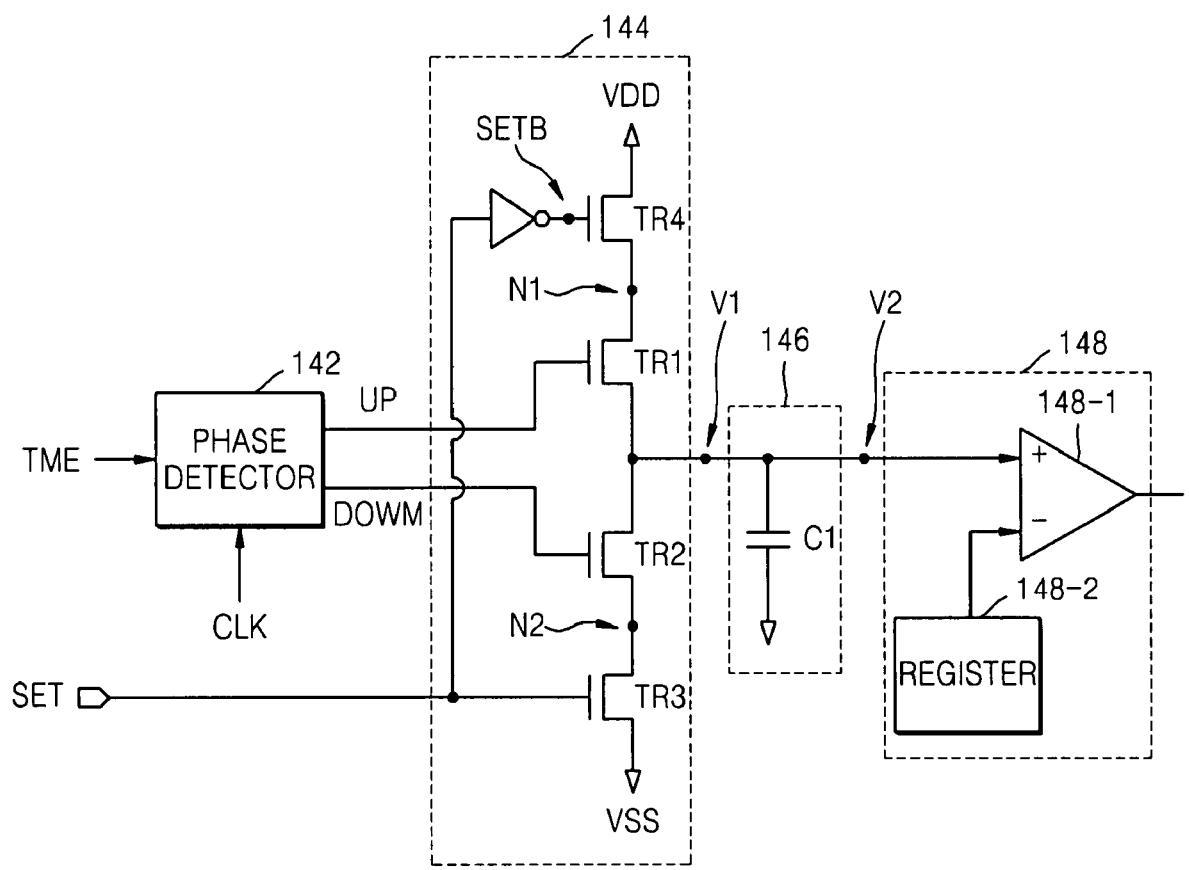
FIG. 4 is a diagram illustrating the BIST circuit unit of FIG. 2 in more detail.

FIG. 4 is a diagram illustrating the BIST circuit unit 120 illustrated in FIG. 2 in more detail.

Referring to FIG. 4, a charge pump 144 may include first, second, third, and/or fourth transistors TR1, TR2, TR3, and/or TR4, and/or an inverter INV. A low pass filter 146 may include a capacitor C1. A pulse width measurer 148 may include a comparator 148-1, in which a first input terminal may be connected to an output voltage V2 of the low pass filter 146 and a second input terminal may be connected to a register 148-2 storing desired reference voltage ranges.

Hereinafter, operations of the charge pump 144 will be described. An UP pulse signal and a DOWN pulse signal outputted from a phase detector 142 may be inputted to gates of the first and second transistors TR1 and TR2. A control signal SET and a reverse control signal SETB may be inputted to gates of the third and fourth transistors TR3 and TR4. When the control signal SET is disabled, the fourth transistor TR4 may be turned on, and thus a voltage of a node 1 N1 may be pulled up to VDD. When the control signal SET is enabled, the fourth transistor TR4 may be turned off, and thus the voltage of the node 1 N1 may be floated.

If the control signal SET is enabled, when the UP pulse signal is applied, the first transistor TR1 may be turned on, and an output voltage V1 may increase in proportion to the amount of time for which the first transistor TR1 is turned on. If the control signal SET is enabled, when the DOWN pulse signal is applied, the second transistor TR2 may be turned on, and the output voltage V1 may decrease in proportion to the amount of time for which the second transistor TR2 is turned on. The UP pulse signal and the DOWN pulse signal may not be simultaneously applied. Accordingly, the output voltage V1 may vary in proportion to the number of times the UP pulse signal and the DOWN pulse signal are inputted.

Hereinafter, operations of the low pass filter 146 will be described. The output voltage V1 outputted from the charge pump 144 may be filtered by the capacitor C1. Filtering may be used to remove high frequency components of the output voltage V1. However, the low pass filter 146 may be omitted when appropriate.

Hereinafter, operations of the pulse width measurer 148 will be described. The voltage V2 output from the low pass filter 146 may be input to a first input terminal of the comparator 148-1 to be compared with a reference voltage range. The reference voltage range may be a standard for determining whether pulses included in a side-band signal accurately realize original data bits, for example. The reference voltage range may differ based on each data pattern. A plurality of reference voltage ranges may be pre-stored in the register 148-2.

Figure 5:
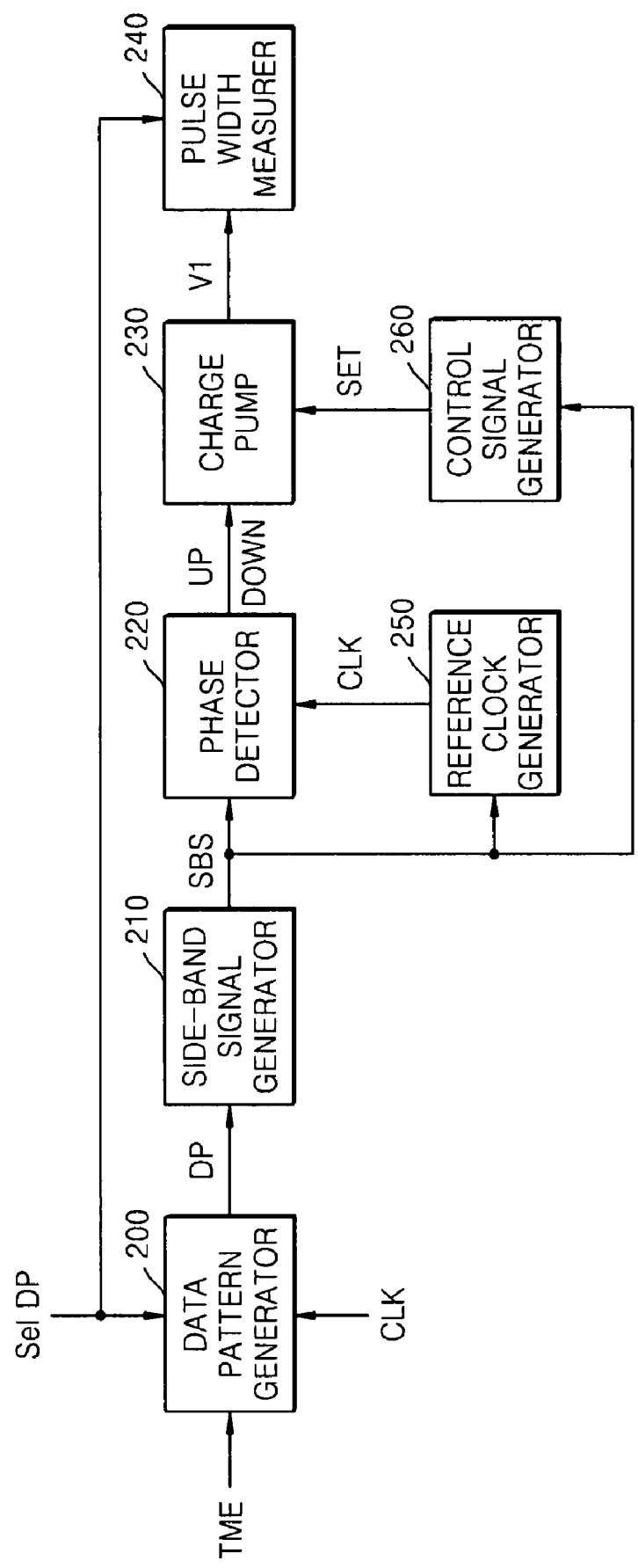
FIG. 5 is a block diagram illustrating an apparatus for measuring a pulse width according to an example embodiment.

FIG. 5 is a block diagram illustrating an apparatus for measuring a pulse width according to another example embodiment.

Referring to FIG. 5, the apparatus may include a data pattern generator 200, a side-band signal generator 210, a phase detector 220, a charge pump 230, a pulse width measurer 240, a reference clock generator 250, and/or a control signal generator 260.

The data pattern generator 200 may receive a test mode enable signal TME and output a given pattern DP in response to a data pattern selection signal Sel DP. The data pattern DP may be a data pattern pre-stored in a register (not shown), for example. The register may be included in the data pattern generator 200. Data patterns DP in various combinations may be stored in the register, and therefore the number of bits and the ratios of 0-bits to 1-bits included in the data patterns DPs may vary. For example, the number of bits in the data pattern DP may be 6, which may provide an efficient test.

The side-band signal generator 210 may output a side-band signal SBS with a modulated pulse width by receiving a given data pattern DP from the data pattern generator 200. For pulses included in the side-band signal SBS to be recognized as certain data, the pulses may be in a permissible pulse width range "H" or a permissible pulse width range "L".

The phase detector 220 may receive the side-band signal SBS output from the side-band signal generator 210 and a reference clock CLK output from the reference clock generator 250, compare phases of the side-band signal SBS and the reference clock CLK, and generate an UP pulse signal or a DOWN pulse signal based on the phase difference. The UP pulse signal may be generated when the phase of the reference clock CLK is higher than the phase of the side-band signal SBS. The DOWN pulse signal may be generated when the phase of the reference clock CLK is lower than the phase of the side-band signal SBS.

When comparing the phases of the side-band signal SBS and the reference clock CLK, the side-band signal SBS may not have to be arranged on a rising edge of the reference clock CLK. The UP pulse signal and the DOWN pulse signal may be pulse signals indicating a relative difference between the side-band signal SBS and the reference clock CLK.

The reference clock generator 250 may generate the reference clock CLK having the same period as the side-band signal SBS by receiving the side-band signal SBS from the side-band signal generator 210. Although the data pattern DP and the side-band signal SBS may have substantially the same period, a period offset may occur between the data pattern DP and the side-band signal SBS. Accordingly, the reference clock CLK may be generated using the side-band signal SBS.

The charge pump 230 may receive the UP pulse signal or the DOWN pulse signal from the phase detector 220 and output an output voltage V1 by increasing or decreasing the output voltage V1 based on the UP pulse signal or the DOWN pulse signal, respectively. The output voltage V1 may change based on the number and length of the pulse widths of the UP pulse signal or the DOWN pulse signal.

A control signal SET generated in the control signal generator 260 may be inputted to the charge pump 230. The control signal SET may be a signal that controls operation schemes of the charge pump 230. Using the control signal SET, wasteful power consumption may be reduced.

The control signal generator 260 may generate the control signal SET by receiving the side-band signal SBS generated from the side-band signal generator 210. Segments of the control signal SET where the control signal SET is enabled are set to correspond to the number of bits of the side-band signal SBS. The side-band signal SBS may be received by the control signal generator 260 while generating the control signal SET because a period offset may occur between the data pattern DP and the side-band signal SBS.

The pulse width measurer 240 may include a register in which a plurality of reference voltage ranges corresponding to each data pattern DP may be stored in a table. The pulse width measurer 240 may receive the data pattern selection signal SeIDP, select the corresponding reference voltage range, and compare the selected reference voltage range with an output voltage V1 of the charge pump 230. The plurality of reference voltage ranges may be set to correspond to the data patterns DP. For example, the reference voltage range may increase or decrease based on the ratio of 0-bits to 1-bits included in the data pattern DP.

When the data pattern selection signal SeIDP is inputted to the pulse width measurer 240, the pulse width measurer 240 may select a desired reference voltage range corresponding to the data pattern selection signal SeIDP from among the plurality of reference voltage ranges stored in a register (not shown), and compare the selected reference voltage range with the output voltage V1 outputted from the charge pump 230. The comparison result may be outputted as logic "H" or logic "L", and thus the pulses included in the side-band signal SBS may be measured to determine whether the pulses have appropriate widths.

Figure 6A:
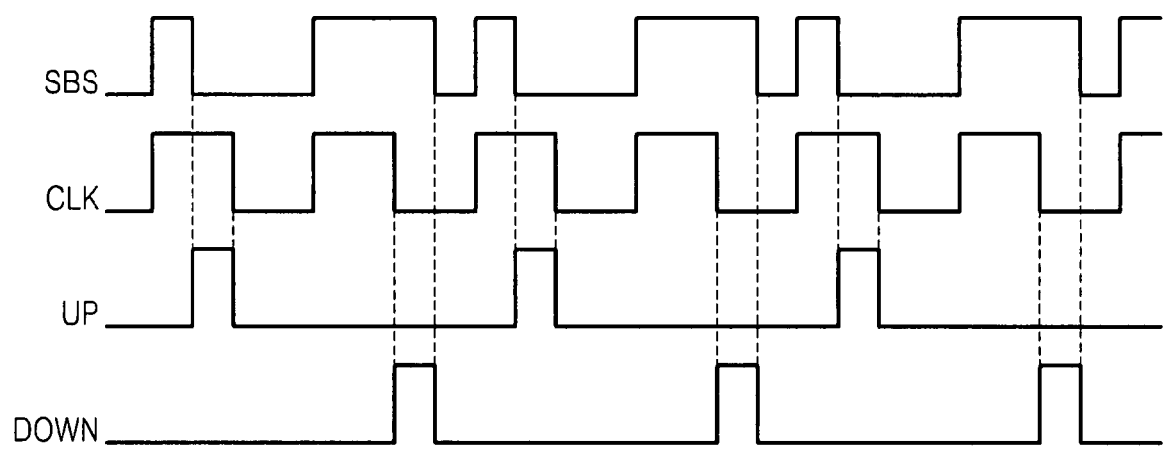
FIGS. 6A and 6B are diagrams illustrating an example side-band signal, example pulse signals, and an example output voltage generated for an example 1:1 ratio of 0-bits to 1-bits in a given data pattern.
Figure 6B:
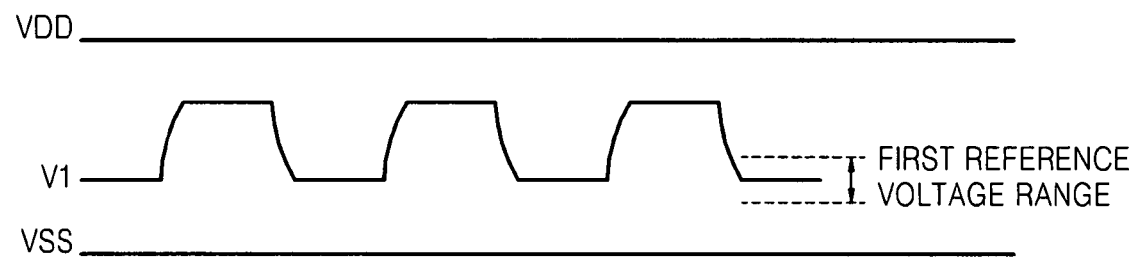

FIGS. 6A and 6B are diagrams illustrating an example side-band signal SBS, example UP pulse and DOWN pulse signals, and an example output voltage V1. The example output voltage V1 of FIG. 6B is generated when a ratio of 0-bits to 1-bits included in a data pattern is 1:1.

FIG. 6A illustrates an example UP pulse signal and DOWN pulse signal generated when the data pattern is "010101", and FIG. 6B illustrates an example output voltage V1 outputted when the data pattern is "010101". Using the example data pattern having the above bit ratio of 1:1, pulse widths may be tested to determine whether the pulse widths indicating a 0-bit and the pulse widths indicating a 1-bit are too narrow or too wide.

When the pulse widths indicating 0-bits and 1-bits included in the side-band signal SBS are narrower than a permissible pulse width, the output voltage V1 may be higher than a first reference voltage range. When the pulses widths are wider than the permissible pulse width, the output voltage V1 may be lower than the first reference voltage range.

Accordingly, when the output voltage V1 is outside the first reference voltage range, it may be determined that the pulse widths indicating 0-bits and 1-bits included in the side-band signal SBS are too narrow or too wide.

Figure 7A:
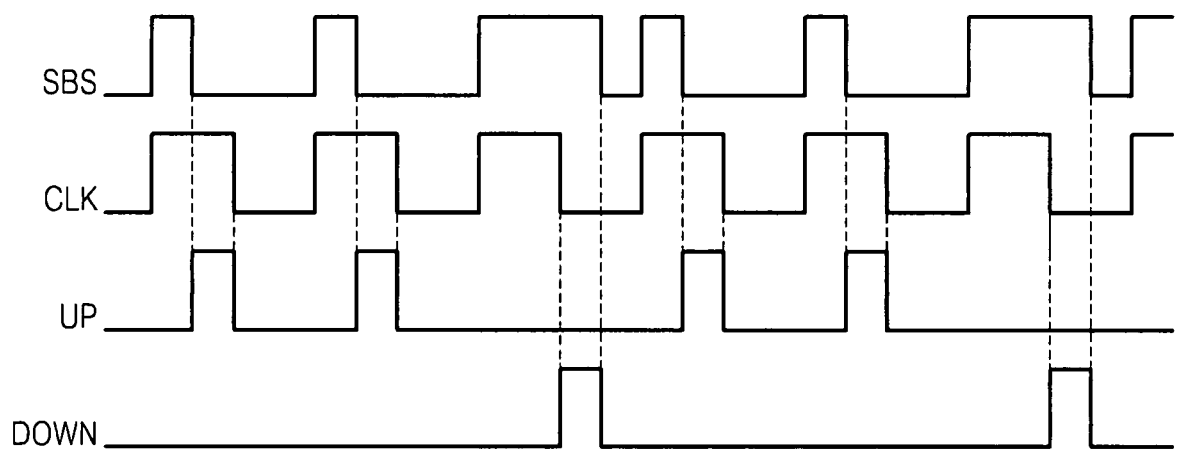
FIGS. 7A and 7B are diagrams illustrating an example side-band signal, example pulse signals, and an example output voltage generated for an example 2:1 ratio of 0-bits to 1-bits in a given data pattern.
Figure 7B:
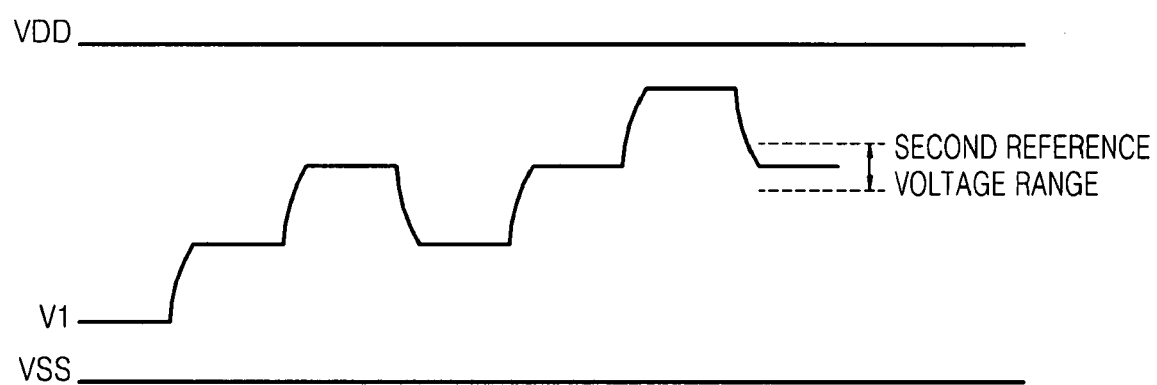

FIGS. 7A and 7B are diagrams illustrating an example side-band signal SBS, example UP pulse and DOWN pulse signals, and an example output voltage V1. The example output voltage V1 of FIG. 7B is generated when a ratio of 0-bits to 1-bits included in a data pattern is 2:1.

FIG. 7A illustrates an example UP pulse signal and DOWN pulse signal generated when the data pattern is "001001", and FIG. 7B illustrates an example output voltage V1 outputted when the data pattern is "001001". Using the data pattern having the above bit ratio of 2:1, pulse widths may be tested to determine whether the pulse widths indicating 0-bits are too narrow and the pulse widths indicating 1-bits are too wide.

When the pulse widths indicating 0-bits included in the side-band signal SBS are each formed narrower than a permissible pulse width, and the pulse widths indicating 1-bits included in the side-band signal SBS are each formed wider than the permissible pulse width, the output voltage V1 may be outside a second reference voltage range.

Accordingly, when the output voltage V1 is outside the second reference voltage range, it may be determined that the pulse widths indicating 0-bits included in the side-band signal SBS are too narrow and the pulse widths indicating 1-bits included in the side-band signal SBS are too wide.

Figure 8A:
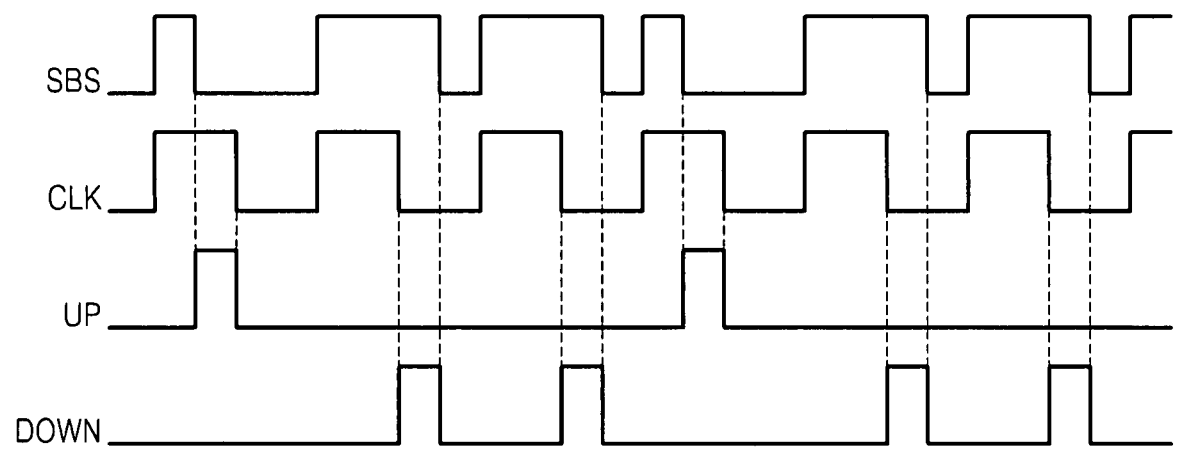
FIGS. 8A and 8B are diagrams illustrating an example side-band signal, example pulse signals, and an example output voltage generated for an example 1:2 ratio of 0-bits to 1-bits in a given data pattern.
Figure 8B:
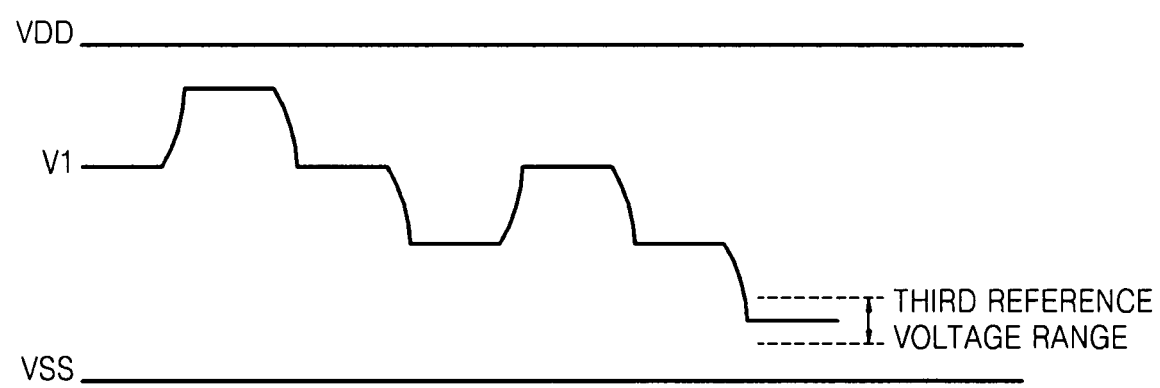

FIGS. 8A and 8B are diagrams illustrating an example side-band signal SBS, example UP pulse and DOWN pulse signals, and an example output voltage V1. The example output voltage V1 is generated when a ratio of 0-bits to 1-bits included in a data pattern is 1:2.

FIG. 8A illustrates an example UP pulse signal and DOWN pulse signal generated when the data pattern is "011011", and FIG. 8B illustrates an example output voltage V1 outputted when the data pattern is "011011". Using the data pattern having the above bit ratio of 1:2, pulse widths may be tested to determine whether the pulse widths indicating 0-bits are too wide and the pulse widths indicating 1-bits are too narrow.

When the pulse widths indicating 0-bits included in the side-band signal SBS are each formed wider than a permissible pulse width, and the pulse widths indicating 1-bits included in the side-band signal SBS are each formed narrower than the permissible pulse width, the output voltage V1 may be outside a third reference voltage range.

Accordingly, when the output voltage V1 is outside the third reference voltage range, it may be determined that the pulse widths indicating 0-bits included in the side-band signal SBS are too wide and the pulse widths indicating 1-bits included in the side-band signal SBS are too narrow.

Figure 9:
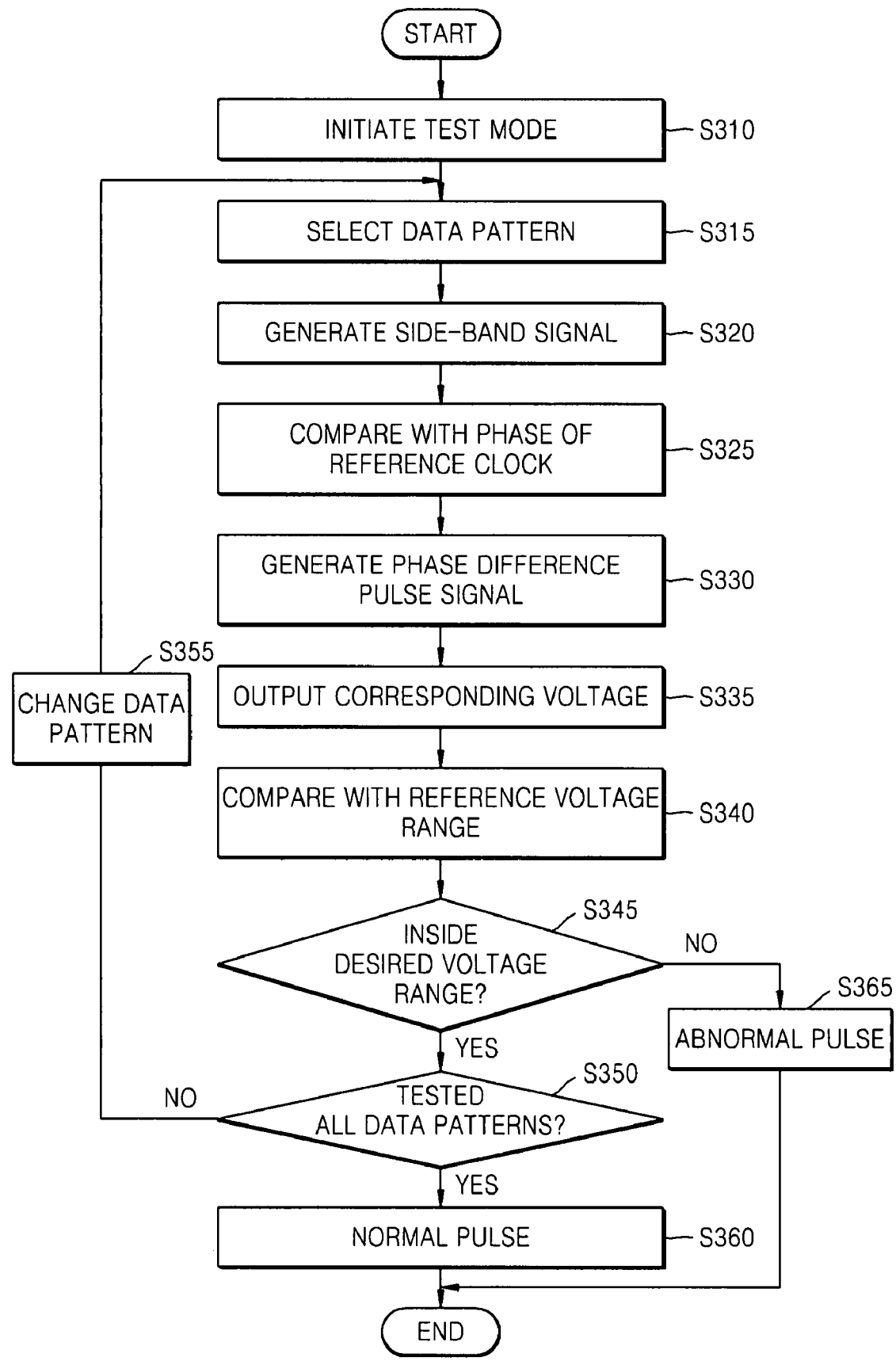
FIG. 9 is a flowchart of a method of measuring a pulse width according to an example embodiment.

FIG. 9 is a flowchart of a method of measuring a pulse width according to an example embodiment.

A test mode may be initiated (at S310) via a test enable signal inputted through a control pin from an outside tester, for example. The test enable signal may be a combination of multiple input signals. After initiating the test mode using the test enable signal, a data pattern may be selected (at S315), and a side-band signal may be generated (at S320) from the selected data pattern. The side-band signal may be a signal having modulated widths of data bits included in the data pattern.

The phase of the side-band signal may be compared with the phase of a reference clock (at S325) and the phase difference may be outputted as a pulse signal (at S330). An output voltage may be changed based on the outputted pulse signal. When the output voltage is changed, the output voltage may be compared with a reference voltage range (at S340) and it may be determined whether the output voltage is outside the reference voltage range (at S345).

When the output voltage is inside the reference voltage range, it may be determined whether all data patterns are tested (at S350). When there is a remaining data pattern to be tested, the data pattern may be changed (at S355) and the process repeated from the beginning. However, when the output voltage is not inside the reference voltage range, it may be determined that the pulse widths included in the side-band signal are abnormal (at S365).

An apparatus and method of measuring a pulse width according to example embodiments may more accurately and quickly measure whether a module generating a side-band signal generates the side-band signal with an appropriate pulse width. Accordingly, error occurrences during data communication using the side-band signal may be reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An apparatus for measuring a pulse width, the apparatus comprising:
   a side-band signal generator configured to receive a given data pattern and output a side-band signal by modulating a pulse width of the received data pattern in a test mode;
   a phase detector configured to receive the side-band signal and a reference clock signal and output a pulse signal corresponding to a phase difference between the received side-band signal and the reference clock signal;
   a charge pump configured to receive the pulse signal and output an output voltage by increasing or decreasing the output voltage based on the pulse signal; and
   a pulse width measurer is further configured to receive the output voltage of the charge pump and determine whether pulses forming the side-band signal have appropriate widths based on whether the output voltage is included in a desired reference voltage range.

2. The apparatus of claim 1, further comprising:
   a data pattern generator including a register, the register storing a plurality of data patterns and the data pattern generator configured to generate a data pattern selected in response to a test mode enable signal and a data pattern selection signal.

3. The apparatus of claim 2, wherein the pulse width measurer includes a register, the register storing a plurality of reference voltage ranges corresponding to each data pattern in a table, and the pulse width measurer is further configured to receive the data pattern selection signal, select a reference voltage range corresponding to the received data pattern selection signal, and compare the selected reference voltage range with the output voltage of the charge pump.

4. The apparatus of claim 1, wherein the phase detector is configured to output an UP pulse signal having a pulse width corresponding to a phase difference between the received side-band signal and the reference clock signal when the phase of the side-band signal is lower than the phase of the reference clock signal, and to output a DOWN pulse signal having a pulse width corresponding to a phase difference between the received side-band signal and the reference clock signal when the phase of the side-band signal is higher than the phase of the reference clock signal.

5. The apparatus of claim 1, wherein the charge pump is configured to receive the control signal and operate only when the control signal is enabled.

6. The apparatus of claim 5, wherein the control signal has enable segments corresponding to the number of bits of the side-band signal.

7. The apparatus of claim 1 further comprising:
   a reference clock generator configured to receive the side-band signal and generate a reference clock signal having substantially the same period as the received side-band signal.

8. The apparatus of claim 1, wherein the phase detector is configured to output the pulse signal by comparing phases of the received side-band signal and the reference clock while the side-band signal does not coincide with a rising edge of the reference clock signal.

9. The apparatus of claim 1, further comprising:
   a low pass filter configured to remove a high frequency component of the output voltage of the charge pump.

10. The apparatus of claim 1, wherein the number of bits of the data pattern is 6.

11. The apparatus of claim 1, wherein the ratio of 0-bits to 1-bits in the data pattern is 1:1.

12. The apparatus of claim 1, wherein the ratio of 0-bits to 1-bits in the data pattern is 2:1.

13. The apparatus of claim 1, wherein the ratio of 0-bits to 1-bits in the data pattern is 1:2.

14. A method of measuring a pulse width, the method comprising:
    receiving a given data pattern and outputting a side-band signal by modulating a pulse width of the received data pattern in a test mode;
    receiving the side-band signal and a reference clock signal and outputting a pulse signal corresponding to a phase difference between the received side-band signal and the reference clock signal;
    receiving the pulse signal and outputting an output voltage by increasing or decreasing the output voltage based on the pulse signal; and
    receiving the output voltage and determining whether pulses forming the side-band signal have appropriate widths based on a comparison result between the received output voltage and the desired reference voltage range.

15. The method of claim 14, further comprising:
    generating a data pattern selected from among a plurality of data patterns in response to a test mode enable signal and a data pattern selection signal.

16. The method of claim 15, wherein determining whether the pulses have appropriate widths is performed by selecting a reference voltage range corresponding to the data pattern selection signal from a register, and comparing the selected reference voltage range and the output voltage.

17. The method of claim 14, wherein outputting the pulse signal comprises:
    outputting an UP pulse signal having a pulse width corresponding to a phase difference between the side-band signal and the reference clock when the phase of the side-band signal is lower than the phase of the reference clock; and outputting a DOWN pulse signal having a pulse width corresponding to a phase difference between the side-band signal and the reference clock when the phase of the side-band signal is higher than the phase of the reference clock.

18. The method of claim 14, wherein outputting the output voltage is controlled by a control signal.

19. The method of claim 18, wherein the control signal has enable segments corresponding to the number of bits of the side-band signal.

20. The method of claim 14, wherein the reference clock has substantially the same period as the side-band signal.

21. The method of claim 14, wherein outputting the pulse signal comprises:

outputting the pulse signal by comparing phases of the received side-band signal and the reference clock while the side-band signal does not coincide with a rising edge of the reference clock signal.

22. The method of claim 14 further comprising:

removing a high frequency component of the output voltage.

23. The method of claim 14, wherein the number of bits of the data pattern is 6.

24. The method of claim 14, wherein the ratio of 0-bits to 1-bits in the data pattern is 1:1.

25. The method of claim 14, wherein the ratio of 0-bits to 1-bits in the data pattern is 2:1.

26. The method of claim 14, wherein the ratio of 0-bits to 1-bits in the data pattern is 1:2.

* * * * *